(12) United States Patent
Panchapakesan et al.

(10) Patent No.: US 10,037,061 B1
(45) Date of Patent: Jul. 31, 2018

(54) MULTIPLE-STAGE COOLING SYSTEM FOR RACK

(71) Applicant: Amazon Technologies, Inc., Reno, NV (US)

(72) Inventors: Rajan Panchapakesan, Seattle, WA (US); Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 1183 days.

(21) Appl. No.: 13/874,367

(22) Filed: Apr. 30, 2013

(51) Int. Cl.
*G06F 1/00* (2006.01)
*G06F 1/20* (2006.01)

(52) U.S. Cl.
CPC .................................. *G06F 1/206* (2013.01)

(58) Field of Classification Search
CPC . G06F 1/206; H05K 7/20745; H05K 7/20836
USPC ........................................ 700/278, 299, 300
See application file for complete search history.

(56) References Cited

U.S. PATENT DOCUMENTS

| | | | |
|---|---|---|---|
| 5,871,396 A | 2/1999 | Shen | |
| 6,259,605 B1 | 7/2001 | Schmitt | |
| 6,545,850 B1 | 4/2003 | Shearman et al. | |
| 6,603,661 B2 | 8/2003 | Smith et al. | |
| 6,621,693 B1 | 9/2003 | Potter et al. | |
| 6,675,976 B2 | 1/2004 | Steinman et al. | |
| 6,791,836 B2 | 9/2004 | Cipolla et al. | |
| 6,795,314 B1 | 9/2004 | Arbogast et al. | |
| 6,822,859 B2 | 11/2004 | Coglitore et al. | |
| 7,031,154 B2 | 4/2006 | Bash et al. | |
| 7,042,722 B2 | 5/2006 | Suzuki et al. | |
| 7,068,509 B2 | 6/2006 | Bash et al. | |
| 7,238,104 B1 | 7/2007 | Greenslade et al. | |
| 7,283,358 B2 | 10/2007 | Campbell et al. | |
| 7,379,299 B2 | 5/2008 | Walsh et al. | |
| 7,403,390 B2 | 7/2008 | Franz et al. | |
| 7,599,183 B2 | 10/2009 | Dittus et al. | |
| 7,660,116 B2 | 2/2010 | Claassen et al. | |
| 7,701,710 B2 | 4/2010 | Tanaka et al. | |
| 7,719,835 B2 | 5/2010 | Schluter | |
| 7,862,410 B2 | 1/2011 | McMahan et al. | |
| 7,869,210 B2 | 1/2011 | Moss | |
| 7,990,700 B2 | 8/2011 | Guo | |
| 8,472,183 B1 | 6/2013 | Ross | |

(Continued)

OTHER PUBLICATIONS

International Search Report for PCT/US2011/051139, dated Dec. 6, 2011, Amazon Technologies, Inc., pp. 1-10.

(Continued)

*Primary Examiner* — Christopher E Everett
(74) *Attorney, Agent, or Firm* — Robert C. Kowert; Meyertons, Hood, Kivlin, Kowert & Goetzel, P.C.

(57) ABSTRACT

A multi-stage air moving system for cooling servers in a rack includes a rack-level air moving device that moves air through the rack, one or more server-level air-moving devices that move air through one or more of the servers, one or more sensors, and an air flow control system. The sensors sense characteristics of air in the rack. The air flow control system includes one or more controllers. The one or more controllers control the rack-level air-moving device and the server-level air moving devices in response to one or more sensed characteristics.

24 Claims, 10 Drawing Sheets

(56) References Cited

U.S. PATENT DOCUMENTS

| | | |
|---|---|---|
| 8,477,491 B1 | 7/2013 | Ross et al. |
| 2003/0067745 A1* | 4/2003 | Patel ................. H05K 7/20745 361/690 |
| 2004/0218355 A1 | 11/2004 | Bash et al. |
| 2004/0233643 A1 | 11/2004 | Bolich et al. |
| 2005/0166860 A1 | 8/2005 | Austin et al. |
| 2005/0182523 A1* | 8/2005 | Nair ................. F24F 11/0001 700/276 |
| 2005/0237716 A1 | 10/2005 | Chu et al. |
| 2006/0274496 A1 | 12/2006 | Lee |
| 2008/0013275 A1 | 1/2008 | Beckley et al. |
| 2008/0055846 A1* | 3/2008 | Clidaras ................. G06F 1/20 361/679.41 |
| 2008/0112127 A1 | 5/2008 | June |
| 2008/0285232 A1 | 11/2008 | Claassen et al. |
| 2009/0086441 A1 | 4/2009 | Randall et al. |
| 2009/0205416 A1* | 8/2009 | Campbell ................. G01F 1/34 73/202.5 |
| 2011/0009047 A1* | 1/2011 | Noteboom ......... H05K 7/20745 454/184 |
| 2012/0044631 A1* | 2/2012 | Wei ................. G06F 1/20 361/679.47 |
| 2012/0057298 A1* | 3/2012 | Wei ................. H05K 7/20754 361/679.49 |
| 2012/0092811 A1 | 4/2012 | Chapel et al. |
| 2012/0215373 A1* | 8/2012 | Koblenz ............ G05D 23/1919 700/300 |
| 2013/0062047 A1* | 3/2013 | Vaney ................. H05K 7/20836 165/287 |
| 2013/0135820 A1* | 5/2013 | Wang ................. H05K 7/20836 361/679.48 |
| 2013/0151011 A1* | 6/2013 | Shih ................. H05K 7/20836 700/275 |
| 2013/0155608 A1* | 6/2013 | Tang ................. G06F 1/20 361/679.48 |
| 2013/0178999 A1* | 7/2013 | Geissler ............. H05K 7/20836 700/300 |
| 2014/0349563 A1* | 11/2014 | Honda ................. F24F 1/0007 454/184 |

OTHER PUBLICATIONS

U.S. Appl. No. 12/886,440, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
Office Action from U.S. Appl. No. 12/886,437, dated May 29, 2012, Peter G. Ross, pp. 1-7.
U.S. Appl. No. 12/886,437, filed Sep. 20, 2010, Peter G. Ross.
Office Action from U.S. Appl. No. 12/886,440, dated May 30, 2012, Peter G. Ross, pp. 1-8.
Office Action from U.S. Appl. No. 12/886,472, dated May 30, 2012, Peter G. Ross, pp. 1-8.
U.S. Appl. No. 14/876,597, filed Oct. 6, 2015, Frink, et al.
U.S. Appl. No. 14/876,602, filed Oct. 6, 2015, Peter G. Ross, et al.
U.S. Appl. No. 14/868,280, filed Oct. 19, 2015, Peter G. Ross, et al.

* cited by examiner

MULTIPLE-STAGE COOLING SYSTEM FOR RACK

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some known data centers include methods and apparatus that facilitate waste heat removal from rack systems. Many existing methods and apparatus may not, however, provide air for cooling in an effective manner to where it is most needed. Moreover, some known data centers include rack systems having configurations that are non-uniform with respect to component density and usage, such that different parts of a rack generate waste heat at a different rate compared to other parts of the rack. In addition, because workloads may be constantly changing and depending on utilization levels, different sections of the rack may have varying levels of activity. Also, one rack may have multiple server configurations, which may cater to different user profiles and feed circuits with different levels of power consumption. In such cases, application of uniform heat removal methods and apparatus to such non-uniform waste heat generation sources may not be fully efficient and effective in waste heat removal.

Figure 1:
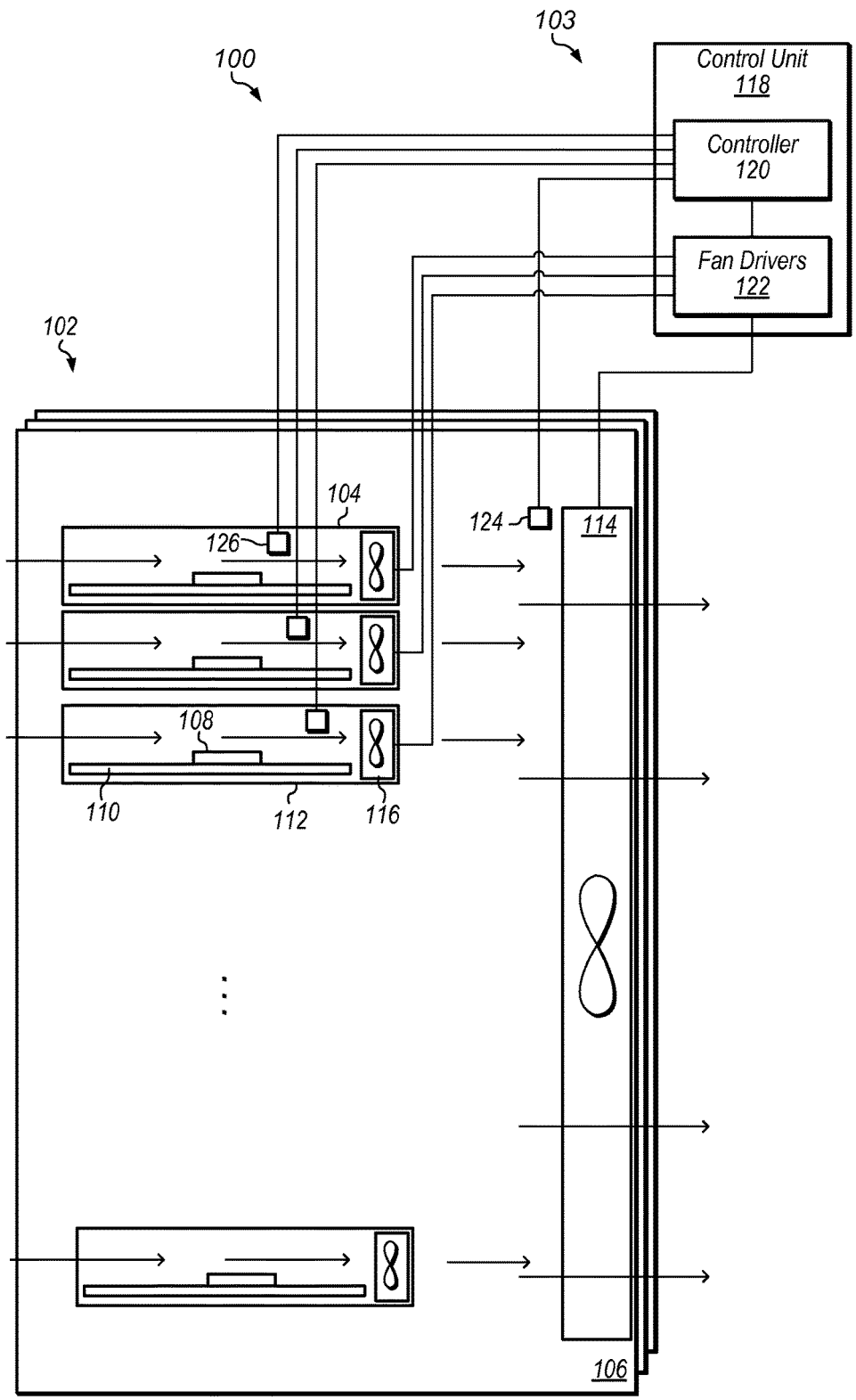
FIG. 1 is a block diagram illustrating one embodiment of a rack computing system that includes a multi-stage cooling system with rack-level and server-level air moving devices.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for cooling electrical device in racks are disclosed. According to one embodiment, a computing system includes a rack, servers coupled to the rack, a rack-level air moving device that moves air through the rack, one or more server-level air-moving devices that move air through one or more of the servers, one or more sensors, and an air flow control system. The sensors sense characteristics of air or thermal characteristics in the rack. The air flow control system includes one or more controllers. The one or more controllers control the rack-level air-moving device and the server-level air moving devices based on sensed characteristics.

According to one embodiment, a multi-stage air moving system for cooling servers in a rack includes a rack-level air moving device that moves air through the rack, one or more server-level air-moving devices that move air through one or more of the servers, one or more sensors, and an air flow control system. One or more of the sensors senses characteristics of air or thermal characteristics in one of the servers. One or more of the sensors senses characteristics of air or thermal characteristics external to the server. The air flow control system includes one or more controllers. The one or more controllers control the air moving devices based on sensed characteristics inside and outside of the server.

According to one embodiment, a method of cooling servers in a rack includes moving air through the rack at a rack level, sensing one or more characteristics in one or more of the servers in the rack, and sensing characteristics outside the servers (for example, a rack-level temperature sensor outside the servers). Air is moved through one or more particular servers in the rack based on characteristics sensed in the rack.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more racks.

As used herein, "ambient" refers to a condition of outside air at the location of a system or data center.

As used herein, "chassis" means a structure or element that supports another element or to which other elements can be mounted. A chassis may have any shape or construction, including a frame, a sheet, a plate, a box, a channel, or a combination thereof. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, a "module" is a component or a combination of components physically coupled to one another. A module may include functional elements and systems, such as computer systems, racks, blowers, ducts, power distribution units, fire suppression systems, and control systems, as well as structural elements, such as a frame, housing, or container. In some embodiments, a module is pre-fabricated at a location off-site from a data center.

As used herein, a "rack" means a rack, container, frame, or other element or combination of elements that can contain or physically support one or more computer systems.

As used herein, "rack computing system" means a system that includes one or more computing devices mounted in a rack.

As used herein, "room" means a room or a space of a building. As used herein, "computing room" means a room of a building in which computing devices, such as rack-mounted servers, can be operated.

As used herein, a "space" means a space, area or volume.

In some embodiments, a multi-stage cooling system includes a rack-level moving device and one or more server-level air moving devices. An air flow control system controls one or more of the server-level air moving devices in response to characteristics of air sensed in the rack.

In some embodiments, a computing system includes servers mounted in a rack with a multi-stage air moving system that cools the servers. The multi-stage air moving system includes a rack-level moving device and one or more server-level air moving devices. An air flow control system controls the rack-level air moving device and one or more of the server-level air moving devices in response to characteristics of air sensed in the rack. Sensors used for controlling the rack may be in the servers, in a portion of the rack external to the servers, or both.

FIG. 1 is a block diagram illustrating one embodiment of a rack computing system that includes a multi-stage cooling system with rack-level and server-level air moving devices. System 100 includes rack computing system 102 and cooling system 103. Rack computing system 102 includes servers 104 and rack 106. Servers 104 are mounted in rack 106. Each of servers 104 includes processor 108 and motherboard 110. Motherboard 110 is installed in server enclosure 112. Servers 104 may also include other components, such as power supply units or mass storage devices such as hard disk drives.

Cooling system 103 includes rack-level air moving device 114, server-level air moving devices 116, and control unit 118. Air moving devices 114 and 116 may include one or more fans. Fans may be DC fans or AC fans. Control unit 118 includes controller 120 and fan drivers 122. Controller 120 may receive signals from each of rack-level sensors 124 and server-level sensors 126.

Based on characteristics of air determined from rack-level sensors 124, one or more server-level sensors 126, or a combination thereof, controller 120 may operate fan drivers 122 to control air flow in each of servers 104. In some embodiments, air flow is controlled independently for each server. For example, air flow for a server may be based on temperature or velocity at one or more locations in the server. For example, if the temperature measured in in the uppermost one of servers 104 exceeds a predetermined threshold (for example, 60 degrees), controller 120 may increase a fan speed of air moving device 116 for the uppermost server, while leaving the fan speed for the air moving devices 116 in the other servers in rack 106 unchanged.

In some embodiments, control unit 118 controls rack-level air moving device 114 to maintain temperatures for rack 106 (for example, the exit temperature of the rack) below a predetermined threshold. Initially, air moving device 114 may be operated at a suitable speed to maintain the rack temperature below the desired maximum. At the same time, a temperature sensor in each of servers 104 may provide information for determining a temperature in the server. For each server, if the temperature exceeds a predetermined threshold, air flow in that server may be increased by activating or increasing the speed of the server-level air moving device associated with the server. For example, if the temperature in the uppermost server 104 exceeds 45 degrees F., but the temperature in the remaining servers in rack 106 remain below 45 degrees F., controller 118 may activate air moving device 116 in the uppermost server.

In the embodiment shown in FIG. 1, both rack-level air moving device 114 and server-level air moving devices 116 are coupled to, and controlled by, the same control unit. Server-level air moving devices and rack-level air moving devices for a rack may nevertheless, in some embodiments, be controlled by two or more different controllers. In one embodiment, a rack-level fan is controlled by a rack-level controller, and a server-level fan in each server in the rack is controlled by its own controller.

In some embodiments, a multi-stage fan system includes a network of fans. Each rack may include multiple levels of fans. Each rack computing system may include a fan door which has a rack level fan, chassis level fans if needed and server-level fans (for example, individual fans embedded at the motherboards).

In some embodiments, a single rack-level fan keeps a constant airflow across all of the rack level components (drives, chassis, switches etc.) if all of the servers are homogeneous, the system may keep the server temperature constant across all of the servers (which may be referred to as a t-threshold). In addition, a controller/sensor at the server level monitors temperature at the server level. If the server level temperature is greater than a threshold, the controller/sensor may automatically turn on one or more of the server-level fans. For a multi-node chassis system, this fan could be placed at the chassis level instead of a server level.

In some embodiments, a multi stage fan system activates the second level fan circuit only for portions of the rack which have higher power dissipation (for example, power hungry servers and/or higher levels of utilization).

In some embodiments, a system includes variable speed fans. In certain embodiments, power switching and/or fan speed are controlled automatically. Fans may be controlled individually, or in groups of two or more fans. In some embodiments, fans are controlled based on sensor data (for example, temperature sensors in the rack).

In certain embodiments, a control system includes at least one programmable logic controller. The PLC may receive measurements of conditions in the rack or at other locations in a data center. A PLC may receive data corresponding to air flow rate, temperature, pressure, humidity, or various other operating or environmental conditions.

In some embodiments, one or more fans of a rack system may be automatically turned on if predetermined characteristics of air are met. In one embodiment, a fan in a server is turned on when a temperature measured in the servers exceeds a threshold temperature (for example, 40 degrees F.).

In one embodiment, the PLC receives data from one or more velocity sensors that measure airflow the rack or a server in the rack. Based on sensor data, the PLC may control parameters such as fan speed, as appropriate for the prevailing operational conditions. In another embodiment, the PLC receives data from one or more temperature sensors that measure temperature in the rack and/or at other locations in a data center. In certain embodiments, a PLC may modulate dampers between open and closed positions to modulate airflow, as appropriate for the prevailing operational conditions.

Sensors in a multi-stage cooling system may sense any of various thermal characteristics of a system or characteristics of air or associated with the system. Rack-level sensors 124 and server-level sensors 126 may, for example, measure thermal conditions of components of a system (for example, a surface temperature or internal temperature of a central processing unit or circuit board, or characteristics of air (for example, air temperature, pressure, or flow rate of air passing through a server).

Figure 2:
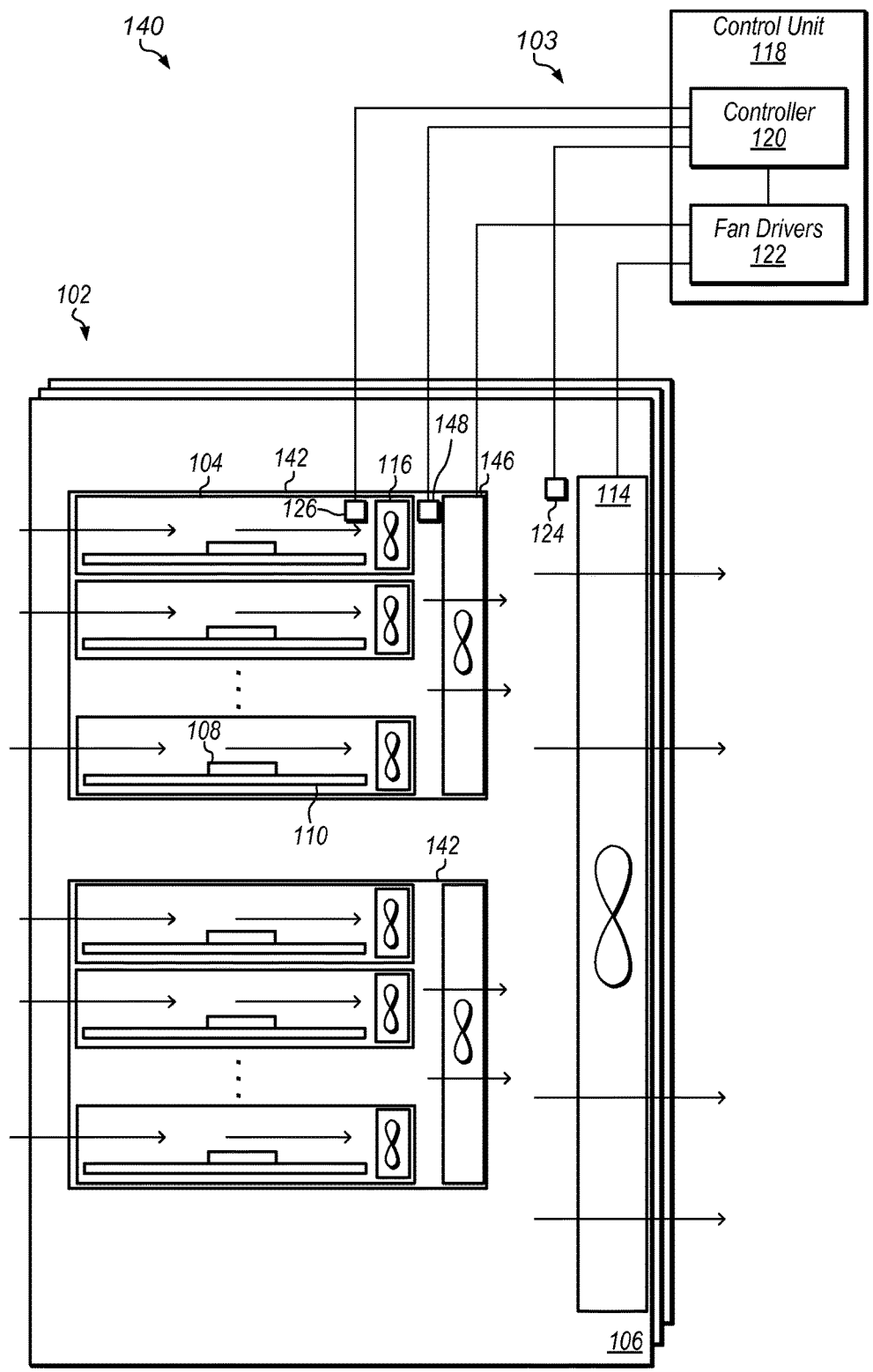
FIG. 2 is a block diagram illustrating one embodiment of a rack computing system that includes a multi-stage cooling system with rack-level, chassis-level, and server-level air moving devices.

FIG. 2 is a block diagram illustrating one embodiment of a rack computing system that includes a multi-stage cooling system with rack-level, chassis-level, and server-level air moving devices. System 140 includes rack computing system 102 and cooling system 103. Rack computing system 102 includes servers 104, chassis 142, and rack 106. Servers 104 are mounted chassis 142. Chassis 142 are mounted in rack 106. Each of servers 104 includes processor 108 and motherboard 110. Motherboard 110 is installed in server enclosure 112. Servers 104 may also include other heat producing components, such as power supply units or mass storage devices such as hard disk drives.

Cooling system 103 includes rack-level air moving device 114, chassis-level air moving devices 146, server-level air moving devices 116, and control unit 118. Rack-level air moving device 114, chassis-level air moving devices 146, and server-level air moving devices 116 may include one or more fans. Fans may be DC fans or AC fans. Control unit 118 includes controller 120 and fan drivers 122. Controller 120 may receive signals from rack-level sensors 124, chassis-level sensors 148, and server-level sensors 126.

Based on characteristics of air determined from rack-level sensors 124, one or more chassis-level sensors 148, one or more server-level sensors 126, or a combination thereof, controller 120 may operate to control fan drivers 122 to control air flow in each of servers 104. In some embodiments, air flow is controlled independently for each of servers 104 and each of chassis 142. Air flow for a server may be based on, in various embodiments, temperature or velocity at one or more locations in the server, chassis, or rack.

In some embodiments, server-level air moving devices, chassis-level air moving devices, or both, are operated selectively to maintain air in different portions of a rack within different parameters. For example, server-level fans may be used to keep the exit temperature in one set of servers at 50 degrees F., and the exit temperature in another set of servers at 60 degrees F.

Figure 3:
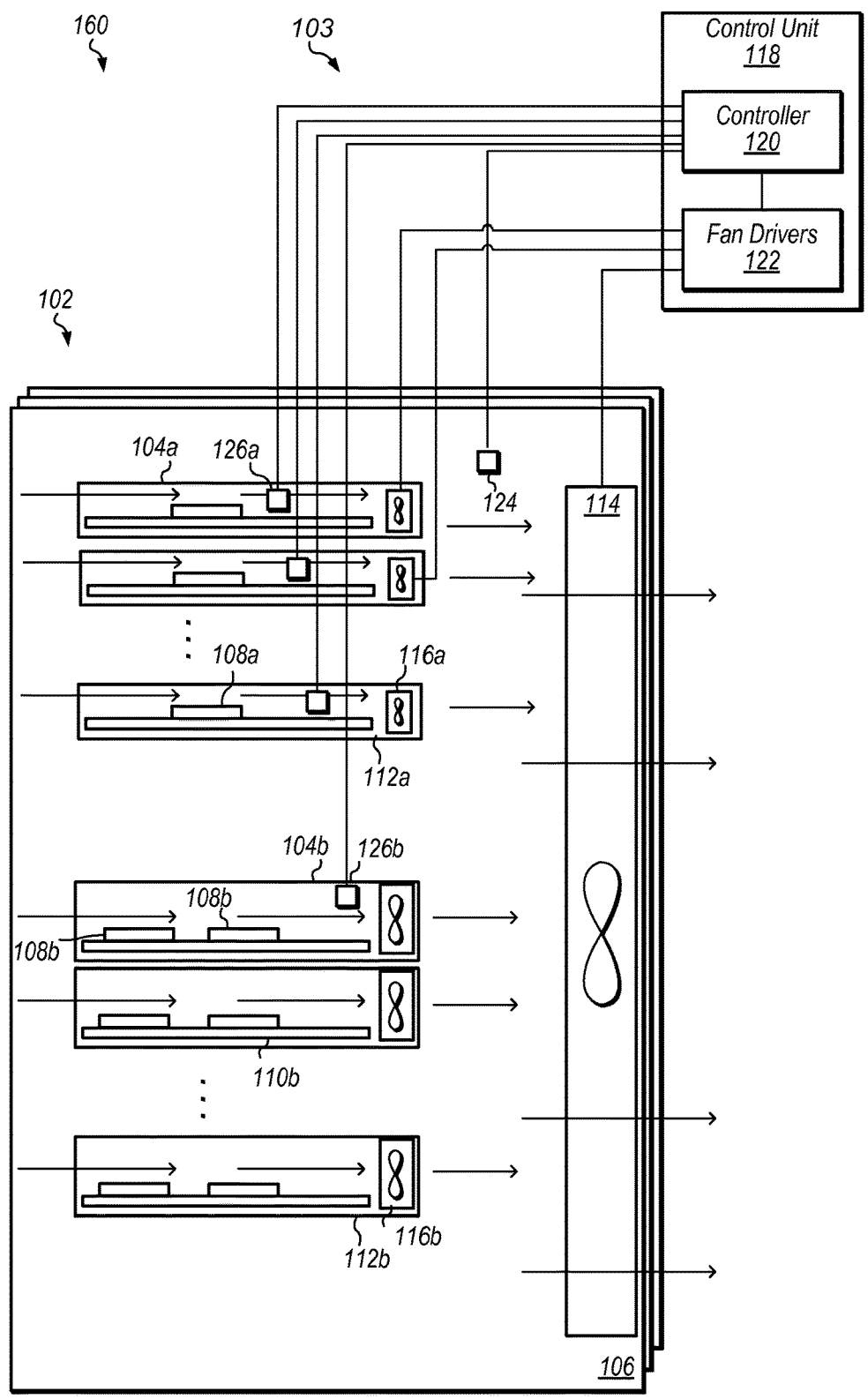
FIG. 3 is a block diagram illustrating one embodiment of a rack computing system that has multiple server types, and a multi-stage cooling system.

In some embodiments, server-level air moving devices, chassis-level air moving devices, or both, are operated selectively to account for servers with different power dissipations in the same rack. Different power dissipation in different parts of rack may occur, for example, where a rack includes multiple server types in the same rack, or when the racks have different usage patterns. FIG. 3 is a block diagram illustrating one embodiment of a rack computing system that has multiple server types, and a multi-stage cooling system. System 160 includes rack computing system 102 and cooling system 103. Rack computing system 102 includes servers 104a, servers 104b, and rack 106. Servers 104a and servers 104b are mounted in rack 106. Servers 104a include processor 108a on motherboard 110a. Motherboard 110a is installed in server enclosure 112a. Servers 104b include processors 108b on motherboard 110b. Motherboard 110b is installed in server enclosure 112b. Servers may also include other heat producing components, such as power supply units or mass storage devices such as hard disk drives.

Based on characteristics of air determined from rack-level sensors 124, one or more server-level sensors 126, or a combination thereof, controller 120 may operate to control fan drivers 122 to control air flow in each of servers 104a and servers 104b. In some embodiments, air flow is controlled independently for each server. For example, air flow for a server may be based on temperature or velocity at one or more locations in the server. For example, if temperature measured in in the uppermost one of servers 104 exceeds a predetermined threshold (for example, 60 degrees), controller 120 may increase a fan speed of air moving device 116 for the uppermost server, while leaving the fan speed for the air moving devices 116 in the other servers in rack 106 unchanged.

In some embodiments, cooling in a rack is adjusted at a server-level or a chassis-level to account for differences in characteristics of the servers. In some embodiments, cooling is adjusted at a server-level to account for differences in power dissipation, air flow impedance, or other characteristics among servers or chassis of different types. For example, in the embodiment shown in FIG. 3, each of servers 104a has only a single processor, while each of servers 104b has dual processors. As such, servers 104b may reject more heat into the air flowing through rack 106 than servers 104a. System 160 may monitor thermal or air flow characteristics in each of servers 104a and servers 104b, and increase or decrease air flow to servers 104b if needed to maintain servers 104b within in acceptable operating range.

Figure 4:
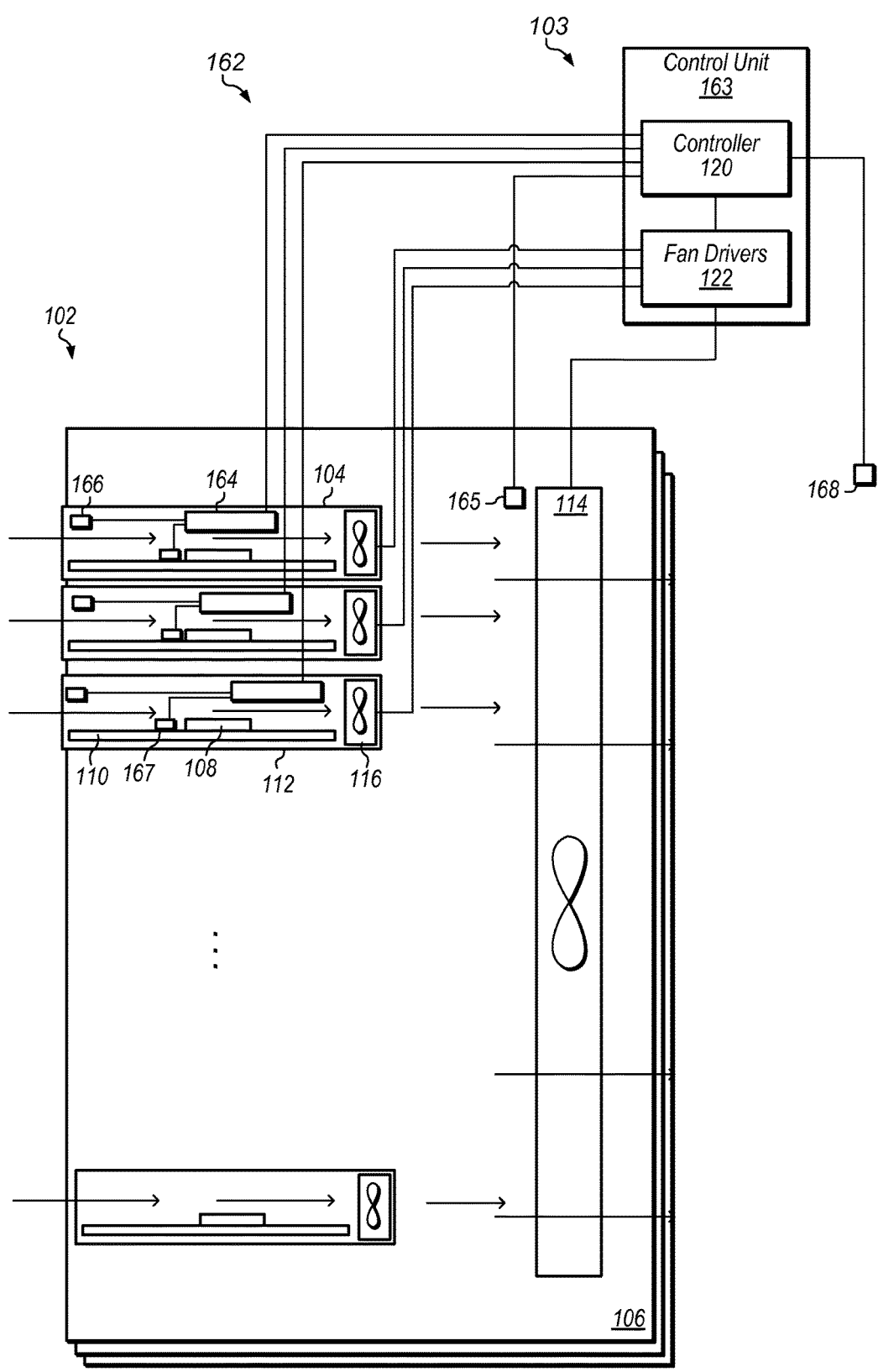
FIG. 4 illustrates one embodiment of a system with control system rack-level and server-level controllers.

In some embodiments, a system for cooling electrical systems (for example, rack-mounted computing devices) includes two or more controllers in among multiple devices in the data center. FIG. 4 illustrates one embodiment of a system that includes a rack-level controller for a rack and server-level controller in each server in the rack. System 162 includes rack-level controller 163 and server-level controllers 164.

In some embodiments, server-level controller 164 control air moving devices 116 in each of servers 104, and controller 163 controls rack-level air moving device 114. Each server-level controller 164 and controller 163 may implement a policy based on information from an air sensors 166, thermal sensor 167 (which may be on a printed circuit board or component) inside server and information from sensors outside of the server, such as in-rack sensor 165 and computing room sensor 168. In some embodiments, the policy implemented by the controllers is based on optimizing efficiency of the cooling system.

In one embodiment, server-level controller 164 in one of servers 104 assesses cooling needs to be increased in the server (for example, based on a thermal sensor on one or more components in the server). Server-level controller 164 may operate based on inputs from outside of the server, and also provide outputs for use in cooling system control at a higher level. If cooling needs to be increased, the server-level controller 164 may query controller 163 for information about other servers 104 in rack 106, or other information (for example, a room-level sensor or outside air sensor. Depending on conditions, server-level controller 164 may operate server-level air moving device 114 to increase or decrease air flow in the server, or send a request to controller 163 to increase or decrease air flow at the rack-level using rack-level air moving device 114. In some embodiments, controller 163 collects information about conditions in multiple servers 104, information external to the servers, or both. Based on the information, controller 163 may send instructions to any or all of server controllers 164 to increase or decrease air flow in each individual server. Controller 163 may operate to increase or decrease air flow at rack-level using rack-level air moving device 114.

Figure 5:
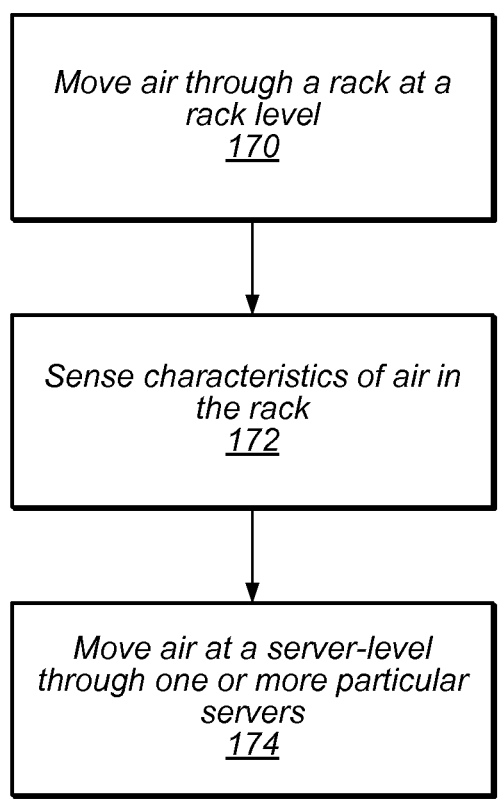
FIG. 5 illustrates one embodiment of cooling of rack-mounted computing devices in a rack in multiple stages.

In some embodiments, a method of cooling servers includes moving air through a rack at a rack-level. Air characteristics in one or more locations in the rack air sensed. Air is moved through one or more particular servers in the rack based on the sensed characteristics of air. FIG. 5 illustrates one embodiment of cooling of rack-mounted computing devices in a rack in multiple stages.

At 170, air is moved through a rack at a rack level. Moving air through a rack may be accomplished, for example, by operating fans in a fan door or fan panel in the rear or front of the rack. In some embodiments, two or more rack-level fans are used to move air through a set of servers in a rack.

At 172, characteristics of air in the rack are sensed. Characteristics of air may be sensed in particular servers in the rack, external to the servers (for example, within the rack cabinet at the air exit of servers in the rack), or both.

At 174, air is moved at a server-level through one or more particular servers in the rack based on at least one of the characteristics of air sensed in the rack. In some embodiments, air flow is controlled at a rack level and at a server level based on characteristics of air sensed in the rack. Air flow may be changed based on characteristics sensed in the rack. In some embodiments, a fan in a server is turned on or turned off based on characteristics of the air. In some embodiments, air flow is controlled to maintain characteristics in one or more servers within a target range, and maintain characteristics at the rack level within a target range.

In some embodiments, server-level or chassis-level air moving device are operated to balance air flow among servers or chassis in rack. For example, an air moving device may be operated to increase air flow in a server that has a relatively high impedance to air flow.

In one embodiment, a system controls a cooling system for electrical systems in a rack using information from one or more sensors in a computing device and one or more sensors external to the computing devices. For example, a controller may be connected to a thermal sensor on a circuit board of each server in a rack, and to an air temperature sensor outside of the servers. Air sensors outside of a server may be located inside a rack in which the server is installed, on the floor a computing room, outside, or at another suitable location. In some embodiments, cooling in one server is controlled based in part on sensor information for one or more other servers.

In some embodiments, a control system controls cooling devices at two or more levels in data center. For example, a control system may control fans in each server in a set of servers in a rack, and control one or more rack-level fans in the same rack.

In some embodiments, a control system optimizes cooling based on sensor information. Optimization may be based on any suitable criteria. In some embodiments, optimization is based on efficiency of fans or other cooling components at different levels in a system. For example, if sensor data indicates that cooling needs to be increased for the majority of servers in a rack, a control system may increase fan speed of a rack-level air moving device. If sensor data indicates that cooling needs to be increased for several racks in a computing room, a control system may increase air flow through a blower for the entire computing room. If sensor data indicates that only one server needs additional cooling, the control system may turn on a server fan, or turn up, a fan in that server only.

In some embodiments, control for cooling computing devices based on sensor data is carried out by implementing one or more rules. Rules may be applied by a controller as described above. Rules may be applied, for example, to automatically determine whether a server fan should be turned on, turned off or adjusted, in what order. Air handling system control may in certain embodiments include one or more optimization calculations. Optimization may include, for example, maintaining temperatures within a predetermined range using sensor data. In certain embodiments, a control system implements a room-level policy that implements a policy for a computing room, which may include control of room-level, rack-level, chassis-level, and server-level control, or combinations thereof.

In various embodiments, a controller may implement one or more policies relating to cooling system management for a rack. For example, a system may implement a policy that if only one or two servers need additional cooling to stay within an acceptable thermal range, the fans in only those two servers are turned up, while if more than two servers need additional cooling, then the rack-level cooling may be turned up (for example, fan speed of one or more fans in a rack door. As another example, if the controller has notice of a fan failure in one of the servers, the controller may turn on or increase air flow through a rack-level fan.

In some embodiments, a cooling system operates in multiple modes. The mode of operation may be selected by a controller based on conditions (thermal conditions of components, air characteristics inside or outside of a rack). In some embodiments, the mode of operation is based on information from controllers at multiple levels in the system. For example, a main cooling system controller may set a mode for the cooling system based on information from server-level controllers, a building management system, or both.

In one embodiment, a control system includes a thermal event mode and an optimization mode. In the thermal event mode, the control system implements a policy to respond to one or more thermal events in or outside the rack. For example, the thermal event may be entered in the event of a spike in power consumption in a set of racks, a failure of CRAC supplying air to the racks, or a failure of a fan in particular rack. In the optimization mode, the control system may control air moving devices based on optimizing efficiency of the cooling system.

Figure 6:
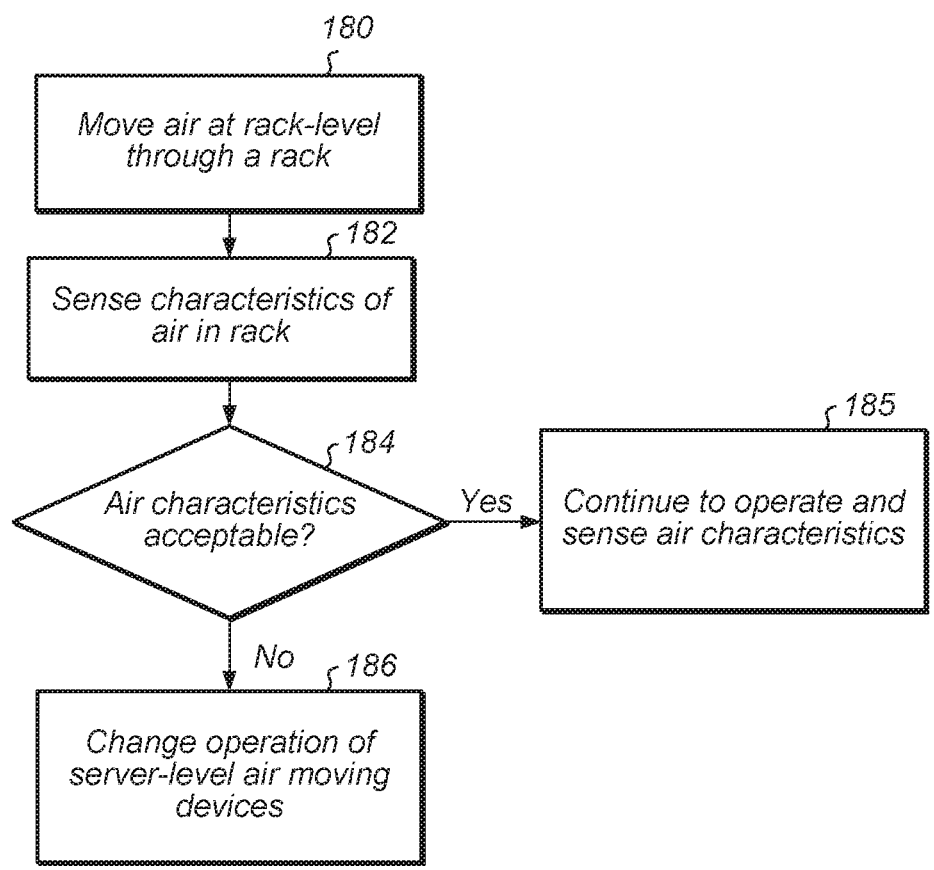
FIG. 6 illustrates one embodiment of two-stage cooling control in a rack based on sensed air characteristics.

In some embodiments, rack-level air moving devices and server-level air moving devices are operated to maintain cooling within predetermined ranges. FIG. 6 illustrates one embodiment of two-stage cooling control in a rack based on sensed air characteristics. At 180, a rack-level air moving device is operated to maintain air flow in a rack. At 182, air characteristics are sensed one or more servers in the rack. Examples of air characteristics that may be sensed include temperature, air velocity, pressure, flow rate, and humidity. At 184, a determination is made whether the air characteristics in a server are within acceptable range for that server. If the characteristics are within an acceptable range for the servers being operated, the system may continue to operate and continue to sense the air characteristics at 185. If the characteristics are not within an acceptable range, operation of one or more air moving devices for that server may be changed 186. In some embodiments, an air moving device is turned on for a server if temperatures exceed a predetermined threshold (for example, above 50 degrees). In some embodiments, an air moving device is turned off for a server if temperatures are below a predetermined threshold (for example, below 40 degrees). In certain embodiments, some of the server-level air moving devices in a rack are operating while other server-level air moving devices remain off.

Figure 7:
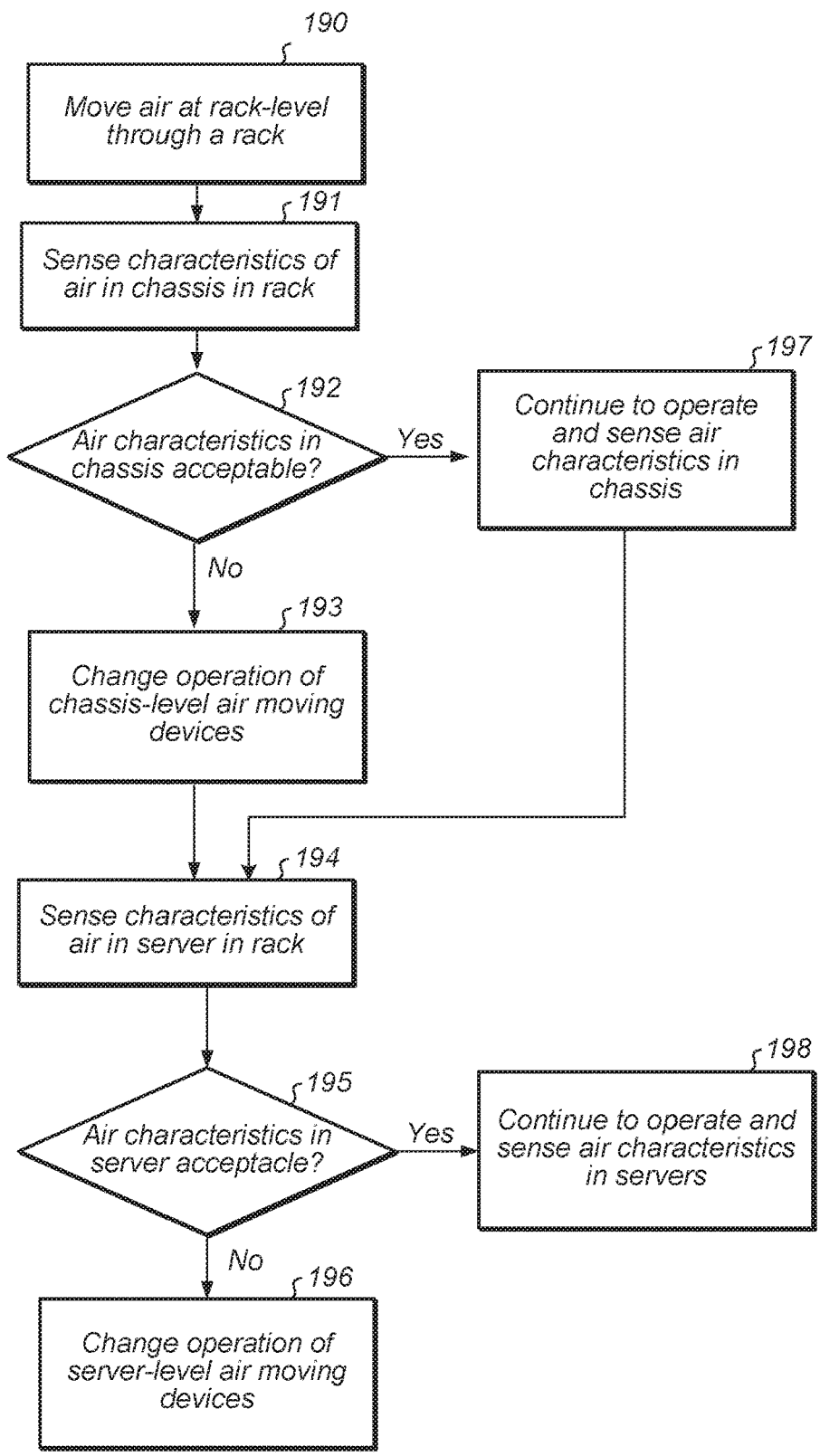
FIG. 7 illustrates one embodiment of three-stage cooling control in a rack based on sensed air characteristics.

FIG. 7 illustrates one embodiment of three-stage cooling control in a rack based on sensed air characteristics. At 190, a rack-level air moving device is operated to maintain air flow in a rack. At 191, air characteristics are sensed one or more chassis units in the rack. Examples of air characteristics that may be sensed include temperature, air velocity, pressure, flow rate, and humidity. At 192, a determination is made whether the air characteristics are within an acceptable range for electrical devices in that chassis. If the characteristics are within an acceptable range for the servers being operated, the system may continue to operate and continue to sense the air characteristics at 197. If the characteristics are not within an acceptable range, operation of one or more air moving devices for the chassis may be changed at 193. For example, if air temperatures are too high in the chassis, one or more chassis level fans associated with that chassis may be activated or run at a higher speed.

At 194, air characteristics are sensed one or more servers in the rack. At 195, a determination is made whether the air characteristics are within acceptable range for that server. If the characteristics are within an acceptable range for the devices being operated, the system may continue to operate and continue to sense the air characteristics at 198. If the characteristics are not within an acceptable range, operation of one or more air moving devices for that server may be changed at 196. For example, if air temperatures are too high in the server, one or more server-level fans associated with that server may be activated or run at a higher speed.

In some embodiments, operation of air moving devices in a multi-stage rack cooling system is carried out by implementing one or more rules. Rules may be applied, for example, to automatically determine which fans should be on, in what order fans should be turned on, what fan speed should be at a given time. Control of a multi-stage rack cooling system may in certain embodiments include one or more optimization calculations.

Figure 8:
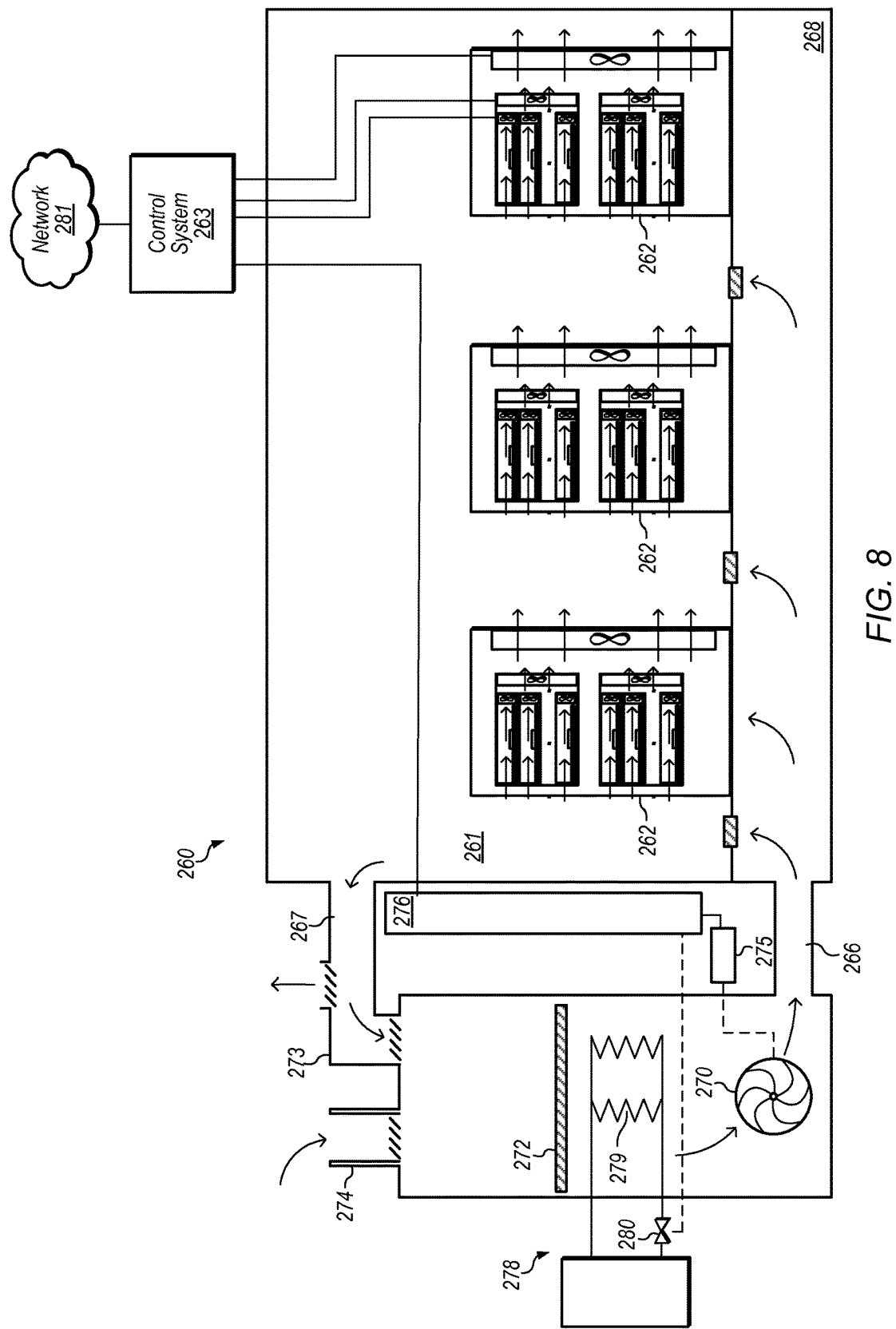
FIG. 8 illustrates one embodiment of a data center with a system for controlling computer room air conditioning (CRAC) units and multi-stage rack level cooling.
Figure 9:
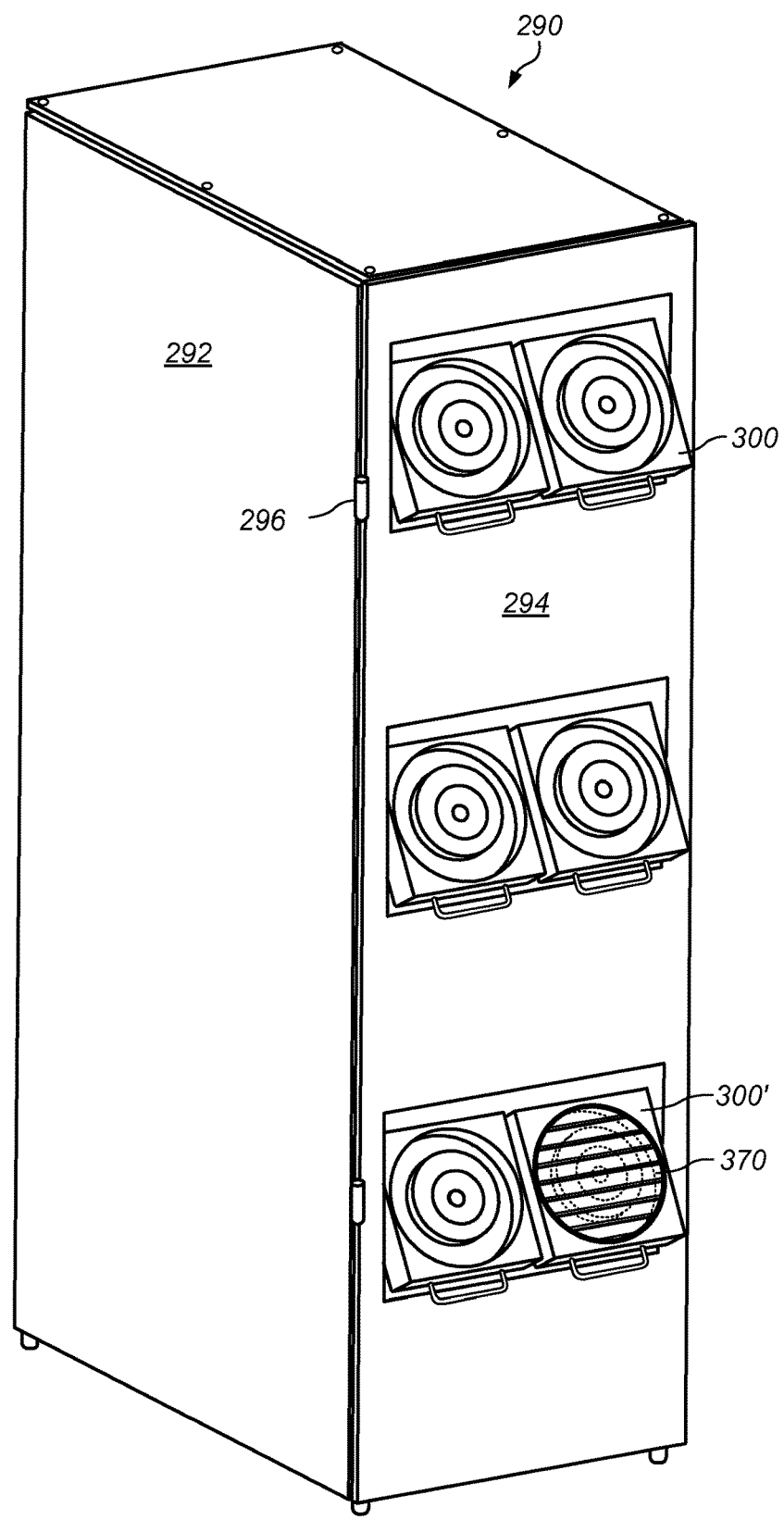
FIG. 9 illustrates a rear view of one embodiment of a fan door assembly for a rack system.

FIG. 8 illustrates one embodiment of a data center with a system for controlling computer room air conditioning (CRAC) units and multi-stage rack level cooling. Data center 260 includes computer room 261, rack computing systems 262, and control system 263. Computer room 261 includes CRAC unit 264. CRAC unit 264 may be operated to remove heat from servers 265 operating in rack computing systems 262.

CRAC unit 264 may be coupled to computer room 261 by supply duct 266 and return duct 267. Cooling air may flow through supply duct 266 into plenum 268. From plenum 268, cooling air may pass through into computer room 261. From the aisles between the racks, cooling air may be drawn into rack computing systems 262. After the air is heated by electrical devices in rack computing systems 262, the air may pass through return duct 267. Air may be recirculated through one or more air handling sub-systems or discharged from the system through exhaust vent 269.

CRAC unit 264 includes fan 270, a humidifier, filter 272, return air vent 273, return air dampers, outside air vent 274, and outside air dampers. Fan 270 is coupled to VFD 275. VFD 275 is coupled to control unit 276. Return air vent 273 may receive air returning from data center room through return duct 267. Outside air vent 274 may receive outside air.

CRAC unit 264 includes chilled water subsystem 278. Chilled water subsystems 278 may be coupled in heat transfer communication with the air handling sub-system of CRAC unit 264. Chilled water sub-system 278 includes coils 279 and valve 280. Valve 280 is coupled to control unit 276. Valve 280 may be opened and closed by signals from control unit 276. The position of valve 280 may be used to regulate the use of chilled water to cool air in the air handling sub-system of CRAC unit 264.

In some embodiments, chilled water subsystem is 278 coupled to a chilled water heat removal system. Examples of chilled water heat removal systems include a service water subsystem, air-conditions refrigerant sub-system, or a cooling tower sub-system.

Control unit 276 may be programmed to control devices in the handling sub-system and/or chilled water sub-system 278. Control system 263 may operate variable frequency drives 275 via control unit 276 to increase or decrease air flow through rack computing systems 262, or to control other operating parameters if CRAC unit 264. Control unit 276 may be coupled to fan 270, humidifier, return air vent 273, return air dampers, outside air vent 274, outside air dampers, and exhaust dampers. Control unit 276 and/or control system 263 may be in data communication with temperature sensors and pressure sensors in rack computing systems 262 and/or computing room 261. Devices in air handling sub-system and chilled water sub-system 278 may be controlled automatically, manually, or a combination thereof.

Control system 263 may be coupled to other system by way of network 281. Other systems may include, for example, remote systems, a building management system, or both. Control system 263 may control air handling operations internally (for example, independent of instructions from other systems), based on instructions or data received from remote systems or a building management system, or any combination thereof.

In certain embodiments, cooling systems in a data center is controlled using environmental sensors inside a data center. Characteristics of air in a data center that may be taken into account include ambient room temperature, pressure, humidity, internal server temperatures, and component temperatures.

In some embodiments, control system 263 control multi-stage cooling within one or more of rack computing systems 262. Operation of rack-level air moving devices, chassis-level air moving devices, and server-level air moving devices may be operated in combination with a computing room-level cooling system, such as CRAC unit 264. For example, CRAC unit 264 is operated to maintain temperatures at the inlets of rack computing systems 262 within a target range. Rack-level air moving devices, server-level air moving devices, and/or chassis-level air moving devices may be controlled to maintain operating conditions in the servers in rack computing systems 262 within acceptable limits. In certain embodiments, CRAC unit 264 is controlled using sensor data from sensors of a multi-stage rack cooling system.

In some embodiments, an air handling control system reports to external systems status or other information relating to the air handling control system. An air handling control system may also report conditions of the operating environment. For example, an air handling control system may report temperature, humidity, and pressure.

In some embodiments, network messages are sent to a from a control system using Simple Network Management Protocol (SNMP) data (for example, an SNMP trap). Any network protocol, however, may be used in various embodiments to send data from, or receive data into, a control system.

In some embodiments, a rack-level air moving devices are implemented by way of a fan door. FIG. 8 illustrates a rear view of one embodiment of a rack system. System 290 includes rack 292 and rear door 294. Rear door 294 couples with rack 292 on hinges 296. Fan modules 300 couple with, and are supported by, rear door 294.

In some embodiments, fan modules 300 include alternating current (AC) fans. In one embodiment, the fans have an input voltage rating of about 100V-120 V. In one embodiment, the fans have an input voltage rating of about 230 V. Fan modules 300 may receive power from rack level power distribution units. In some embodiments, fan modules 300 in a rack are hot swappable. In some embodiments, a manual power switch is provided for each of fan modules 300.

In one embodiment, each fan operates at a flow rate between 50 to 100 cubic feet per minute. In one embodiment, each of fans 302 operates at a flow rate about 200 cubic feet per minute.

Figure 10:
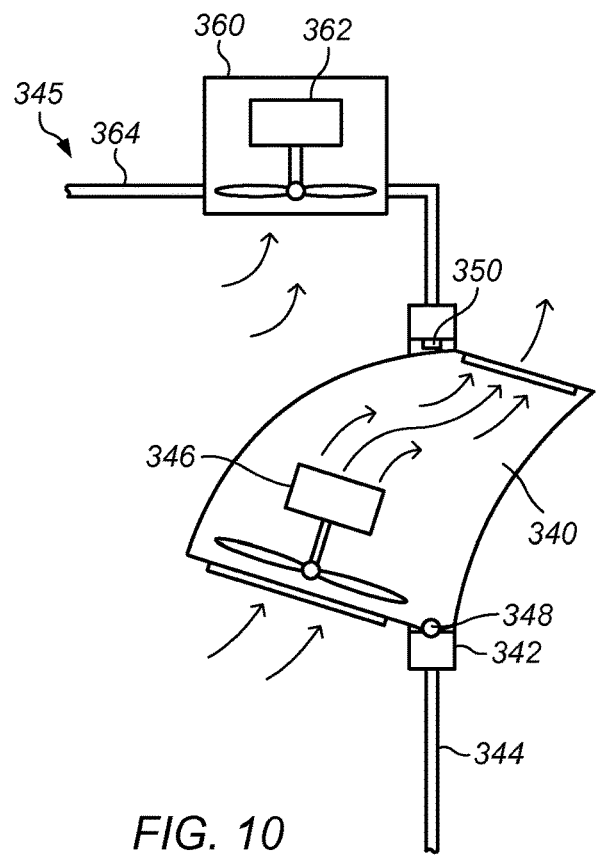
FIG. 10 illustrates one embodiment of a fan with an adjustable mounting.

In some embodiments, the angle of a rack-mounted fan is adjustable. FIG. 10 illustrates one embodiment of a fan with an adjustable mounting. System 338 includes fan module 340. Fan module 340 is rotatably coupled on fan module mount 342. Fan module mount 342 is mounted in rear panel 344 of rack 345. Fan module 340 includes fan 346.

Fan module 340 may be rotatably coupled to fan module mount 344. Fan module 340 is coupled to fan module mount 342 at pivot connection 348. The angle of fan module 342 may be adjusted by rotating fan module 340 on pivot connection 348.

Rack 345 includes roof fan module 360 mounted in roof 364. Fan 362 of roof fan module 360 may operate in combination with one or more fans 340 in rear panel 344 to provide a low pressure region in the rear portion of rack. In one embodiment, a rack includes one row of fans on the roof of a rack and two rows of fans spaced from top to bottom in the rear door of the rack.

Figure 11:
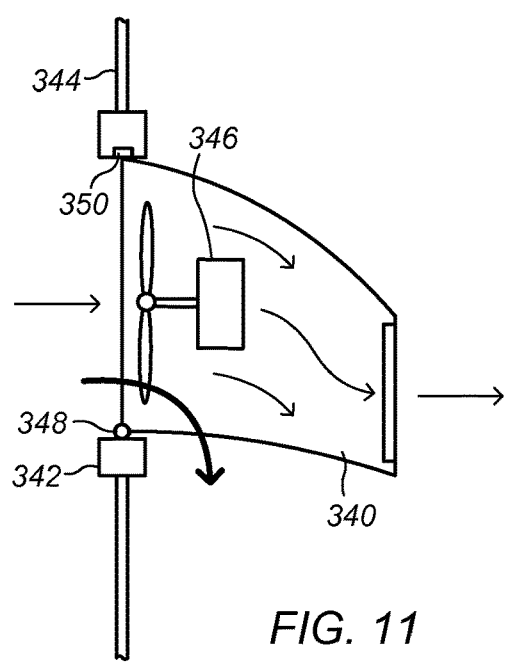
FIG. 11 illustrates an adjustable fan adjusted to a vertical angle.

FIG. 11 illustrates an adjustable fan adjusted to a vertical angle. In one embodiment, locking mechanism 350 is released to allow the angle of fan module 340 to be adjusted. Fan module 340 may be rotated on pivot connection 348 to a vertical angle. Once fan module 340 is in position, locking mechanism 350 may be operated to lock fan module 340 at the desired angle.

In some embodiments, a system may include variable speed fans. In certain embodiments, power switching and/or fan speed may be controlled automatically. Fans may be controlled individually, or in groups of two or more fans. In some embodiments, fans are controlled based on sensors data (for example, temperature sensors in the rack).

In some embodiments, one or more fans for a rack system may be controlled via a control system. In certain embodiments, a control system includes at least one programmable logic controller. The PLC may receive measurements of conditions in the rack or at other locations in a data center. A PLC may receive data corresponding to air flow rate, temperature, pressure, humidity, or various other operating or environmental conditions.

In one embodiment, the PLC receives data from one or air flow sensors that measure airflow in the rack. Based on sensor data, the PLC may control parameters such as fan speed, as appropriate for the prevailing operational conditions. In another embodiment, the PLC receives data from one or more temperature sensors that measure temperature in the rack and/or at other locations in a data center. In certain embodiments, a PLC may modulate dampers between open and closed positions to modulate airflow, as appropriate for the prevailing operational conditions.

In some embodiments, a PLC may receive data from thermal sensors in a rack power distribution unit. In certain embodiments, a PLC may control switching in a rack power distribution unit.

In certain embodiments, angular adjustment of a fan may be automated.

For example, the angle of fan module 340 relative to rack 292 may be controlled with an actuator coupled to the fan module. The actuator may be controlled by a PLC to adjust the angle of fan module 340.

In some embodiments, a system may include fan failure detection devices. In one embodiment, each of fan modules 300 is provided with a Hall effect sensor. The Hall effect sensor may provide a signal to a control system that a fan is not operating.

In some embodiments, one or more fans of a rack system may be provided with a device that automatically shuts off air flow through the fan if the rate of air flow through the fan drops below a predetermined threshold. For example, referring to FIG. 8, fan module 300' may include louvers 370. Louvers 370 may automatically close if air flow through fan module 300' drops below a predetermined level. For example, if fan module 300' fails, louvers 370 may automatically close to shut off air flow through the fan. Automatically shutting off air flow to a rack-mounted fan may reduce back flow of air into rack 102 in the event of a failure of fan module 300'. In some embodiments, all of the fan modules on a rack may include louvers for shutting off air flow in the event of a fan failure.

In certain embodiments, air flow through computer systems in a rack may be provided using fans internal to the computer systems instead of, or in addition to, rack-mounted fans. For example, a series of fans may be provided at the rear of the chassis of each of the computer systems in a rack. In certain embodiments, air flow for computer systems in a rack may be produced by an air handling system external to the rack.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system, comprising:
 a rack;
 two or more servers coupled to the rack;
 a rack-level air moving device configured to move air through the rack;
 one or more server-level air moving devices within at least one server of the two or more servers, wherein the one or more server-level air moving devices are configured to move air through the at least one server;
 one or more server-level sensors within the at least one server, wherein the one or more server-level sensors are configured to sense one or more air characteristics, thermal characteristics, or both, in the at least one server;
 one or more rack-level sensors configured to sense one or more air characteristics, thermal characteristics, or both, in the rack; and
 an air flow control system comprising one or more controllers, wherein the one or more controllers are configured to control the rack-level air-moving device and at least one of the server-level air moving devices, based at least in part on one or more characteristics sensed by at least one of the one or more server-level sensors or the one or more rack-level sensors, wherein the air flow control system is configured to, during operation of at least one of the two or more servers:
  control the rack-level air moving device to move air through the rack;
  responsive to a determination that at least one of the one or more sensed characteristics falls outside of a corresponding acceptable range, adjust a respective server-level air moving device to change a rate of air flow through the corresponding server and control the rack-level air moving device to maintain a rate of air flow through the rack provided by the one or more rack-level air moving devices; and
  subsequent to the adjustment, responsive to a determination that the at least one of the one or more sensed characteristics falls within the corresponding acceptable range, readjust the respective server-level air moving device to change the rate of air flow through the corresponding server, and control the rack-level air moving device to maintain the rate of air flow through the rack.

2. The computing system of claim 1, wherein at least one of the controllers is configured to control the rack-level air moving device and at least one of the server-level air moving devices based at least in part on a policy, wherein the policy is based at least in part on efficiency of the server-level air moving devices in moving air through at least one of the servers.

3. The computing system of claim 1, wherein the air flow control system is configured to control at least one of the server-level air moving devices in the rack independent of an air moving device in at least one other of the servers in the rack.

4. The computing system of claim 1, wherein the air flow control system is configured to:
 control rack-level air flow to maintain at least one temperature in the rack at or below a predetermined maximum temperature; and
 control server-level air flow in at least one of the servers to maintain at least one temperature in at least one of the servers at or below a predetermined maximum temperature.

5. A multi-stage air moving system for cooling servers in a rack, comprising:
 one or more rack-level air moving devices configured to move air through the rack;
 one or more server-level air moving devices within one or more servers in the rack, wherein the one or more server-level air moving devices are configured to move air through the one or more servers;
 one or more server-level sensors within at least one server of the one or more servers, wherein the one or more server-level sensors are configured to sense one or more air characteristics, thermal characteristics, or both in the at least one server;
 one or more other sensors configured to sense one or more air characteristics, thermal characteristics, or both, external to the at least one server; and
 an air flow control system comprising one or more controllers, wherein at least one of the controllers is configured to control at least one of the air moving devices based in part on one or more characteristics sensed by at least one of the one or more server-level sensors and based in part on one or more characteristics sensed by at least one of the one or more other sensors, wherein the air flow control system is configured to, during operation of at least one of the two or more servers:
    control the rack-level air moving device to move air through the rack;
    responsive to a determination that at least one of the one or more sensed characteristics falls outside of a corresponding acceptable range, adjust a respective server-level air moving device to change a rate of air flow through the corresponding server and control the rack-level air moving device to maintain a rate of air flow through the rack provided by the one or more rack-level air moving devices; and
    subsequent to the adjustment, responsive to a determination that the at least one of the one or more sensed characteristics falls within the corresponding acceptable range, readjust the respective server-level air moving device to change the rate of air flow through the corresponding server, and control the rack-level air moving device to maintain the rate of air flow through the rack.

6. The multi-stage air moving system of claim 5, wherein the at least one controller is configured to control air moving devices at two or more levels based at least in part on optimizing efficiency of the air moving devices.

7. The multi-stage air moving system of claim 5, wherein at least one controller is configured to control cooling in at least two different modes, wherein, in at least one of the modes, the at least one controller is configured to control air moving devices at two or more levels based at least in part on optimizing efficiency of the air moving devices.

8. The multi-stage air moving system of claim 5, wherein the air flow control system is configured to control at least one of the rack-level air moving devices.

9. The multi-stage air moving system of claim 5, wherein at least one of the controllers is configured to control at least two of the server-level air moving devices.

10. The multi-stage air moving system of claim 5, further comprising one or more chassis-level air moving devices in a chassis of the rack, wherein each of at least one of the chassis-level air moving devices is configured to move air through two or more servers coupled to the chassis, wherein the air moving control system is configured to control the at least one chassis-level air moving device.

11. The multi-stage air moving system of claim 5, wherein at least one server-level air moving device in at least one of the servers is downstream from one or more heat producing components of the server, wherein the at least one server-level air moving device is configured to draw air through the at least one server.

12. The multi-stage air moving system of claim 5, wherein one of the controllers is configured to control at least one of the rack-level air moving devices and at least one of the server-level air moving devices.

13. The multi-stage air moving system of claim 5, wherein the air moving control system includes at least two controllers, wherein each of at least two of the controllers is configured to control an air moving device in a different server.

14. The multi-stage air moving system of claim 5, wherein at least one of the controllers is configured to control at least one of the server-level air moving devices in at least one of the servers based at least in part on air characteristics external to the at least one server.

15. The multi-stage air moving system of claim 5, wherein at least one of the controllers is configured to control at least one of the server-level air moving devices in at least one of the servers based at least in part on characteristics in at least one other server in the rack.

16. The multi-stage air moving system of claim 5, wherein at least one of the controllers is configured to control at least one of the server-level air moving devices in at least one of the servers based at least in part on rack-level characteristics.

17. The multi-stage air moving system of claim 5, wherein at least one of the controllers is configured to control at least one of the server-level air moving devices based at least in part on a temperature sensed at one or more locations in the rack.

18. The multi-stage air moving system of claim 5, wherein at least one of the controllers is configured to control at least one of the server-level air moving devices based at least in part on an air velocity sensed at one or more locations in the rack.

19. A method of cooling servers in a rack, comprising:
    moving air through the rack at a rack level via one or more rack-level air moving devices;
    sensing, via one or more server-level sensors within at least one server in the rack, one or more air characteristics, thermal characteristics, or both, in the at least one server;
    sensing one or more air characteristics, thermal characteristics, or both, external to the at least one server;
    moving air through a particular server of the at least one server in the rack via a server-level air moving device within the particular server, wherein the moving air through the particular server is based at least in part on at least one of:
        the sensing one or more characteristics in the at least one server; or
        the sensing one or more characteristics external to the at least one server;
    responsive to a determination that at least one of the one or more sensed characteristics falls outside of a corresponding acceptable range, adjusting a respective server-level air moving device to change a rate of air flow through the corresponding server and controlling the rack-level air moving device to maintain a rate of air flow through the rack provided by the one or more rack-level air moving devices; and
    subsequent to the adjustment, responsive to a determination that the at least one of the one or more sensed characteristics falls within the corresponding acceptable range, readjusting the respective server-level air moving device to change the rate of air flow through the corresponding server, and controlling the rack-level air moving device to maintain the rate of air flow through the rack.

20. The method of claim 19, wherein moving air through the particular server comprises implementing one or more policies by controlling air flow at two or more levels in the rack to increase efficiency of the air moving devices.

21. The method of claim 19, wherein moving air through the particular server comprises changing a rate of air flow through the particular server in response to sensed characteristics.

22. The method of claim 19, further comprising controlling air flow to:
    maintain a characteristic in the rack within a first predetermined level; and
    maintain the characteristic in at least one of the servers at a second predetermined level.

23. The method of claim 19, further comprising:
controlling the rack-level air flow to maintain at least one temperature in the rack below a predetermined maximum temperature; and
controlling server-level air flow in at least one of the servers to maintain at least one temperature in the server below a predetermined maximum temperature.

24. The method of claim 19, wherein the rack comprises a first server having a first set of heat producing characteristics and second server having a second set of heat producing characteristics, the method further comprising:
moving air through a first server in the rack based on measured characteristics; and
moving air through a second server in the rack based on measured characteristics, wherein air is moved through the first server at a different rate than that of the second server.

* * * * *